US010816600B1

(12) United States Patent
Liddell et al.

(10) Patent No.: US 10,816,600 B1
(45) Date of Patent: Oct. 27, 2020

(54) PROTOCOL ANALYSIS AND VISUALIZATION DURING SIMULATION

(71) Applicant: Xilinx, Inc., San Jose, CA (US)

(72) Inventors: David K. Liddell, Longmont, CO (US); Paul R. Schumacher, Berthoud, CO (US)

(73) Assignee: Xilinx, Inc., San Jose, CA (US)

(*) Notice: Subject to any disclaimer, the term of this patent is extended or adjusted under 35 U.S.C. 154(b) by 231 days.

(21) Appl. No.: 15/824,789

(22) Filed: Nov. 28, 2017

(51) Int. Cl.
*G01R 31/3183* (2006.01)
*G01R 31/28* (2006.01)
*G06F 30/33* (2020.01)
*G01R 31/3193* (2006.01)

(52) U.S. Cl.
CPC ...... *G01R 31/318314* (2013.01); *G01R 31/2846* (2013.01); *G06F 30/33* (2020.01); *G01R 31/31932* (2013.01)

(58) Field of Classification Search
CPC ........ G01R 31/318314; G01R 31/2846; G01R 31/31932; G06F 17/5022
See application file for complete search history.

(56) References Cited

U.S. PATENT DOCUMENTS

| | | | | |
|---|---|---|---|---|
| 7,283,944 B2* | 10/2007 | Tsai | .................... | G06F 17/5022 703/15 |
| 8,869,093 B2* | 10/2014 | Elliott | ................. | G06F 17/5009 710/100 |
| 8,935,133 B1* | 1/2015 | Berg | .................... | G06F 17/5009 703/14 |
| 9,792,402 B1* | 10/2017 | Ovadia | ............... | G06F 17/5081 |
| 2002/0049578 A1* | 4/2002 | Ohkami | .................. | G06F 30/33 703/15 |
| 2007/0276644 A1* | 11/2007 | Veller | ................. | G06F 17/5022 703/14 |
| 2012/0150522 A1* | 6/2012 | Yeller; Yossi | ...... | G06F 17/5022 703/14 |
| 2014/0351795 A1* | 11/2014 | Alfieri | ................... | G06F 11/362 717/125 |
| 2016/0321159 A1* | 11/2016 | Romm | .................. | G06F 11/364 |
| 2017/0115348 A1* | 4/2017 | Schelle | ............ | G01R 31/31703 |
| 2017/0293702 A1* | 10/2017 | Clark | ...................... | G06F 13/00 |
| 2018/0300440 A1* | 10/2018 | Ali | ....................... | G06F 17/5045 |
| 2019/0044840 A1* | 2/2019 | Agrawal | ................. | H04L 43/18 |

OTHER PUBLICATIONS

Specification and drawing for U.S. Appl. No. 14/887,080, filed Oct. 19, 2015, Schumacher et al.
Xilinx, "Application Profiling in the SDAccel Environment," UG1023 (v.2016.5), Mar. 9, 2017, pp. 36-55, Xilinx, Inc., San Jose, California, USA.
Specification and drawing for U.S. Appl. No. 15/824,631, filed Nov. 28, 2017, Schumacher et al.

* cited by examiner

*Primary Examiner* — Nha T Nguyen
(74) *Attorney, Agent, or Firm* — Kevin T. Cuenot

(57) ABSTRACT

Protocol analysis can include simulating, using a processor, a circuit design including a protocol analyzer embedded therein. The protocol analyzer can be coupled to low-level signals of an interface of the circuit design. During the simulating, the protocol analyzer detects a transaction from the low-level signals received from the interface. Transaction data is generated by the protocol analyzer specifying the transaction. The transaction data is output from the protocol analyzer.

16 Claims, 3 Drawing Sheets

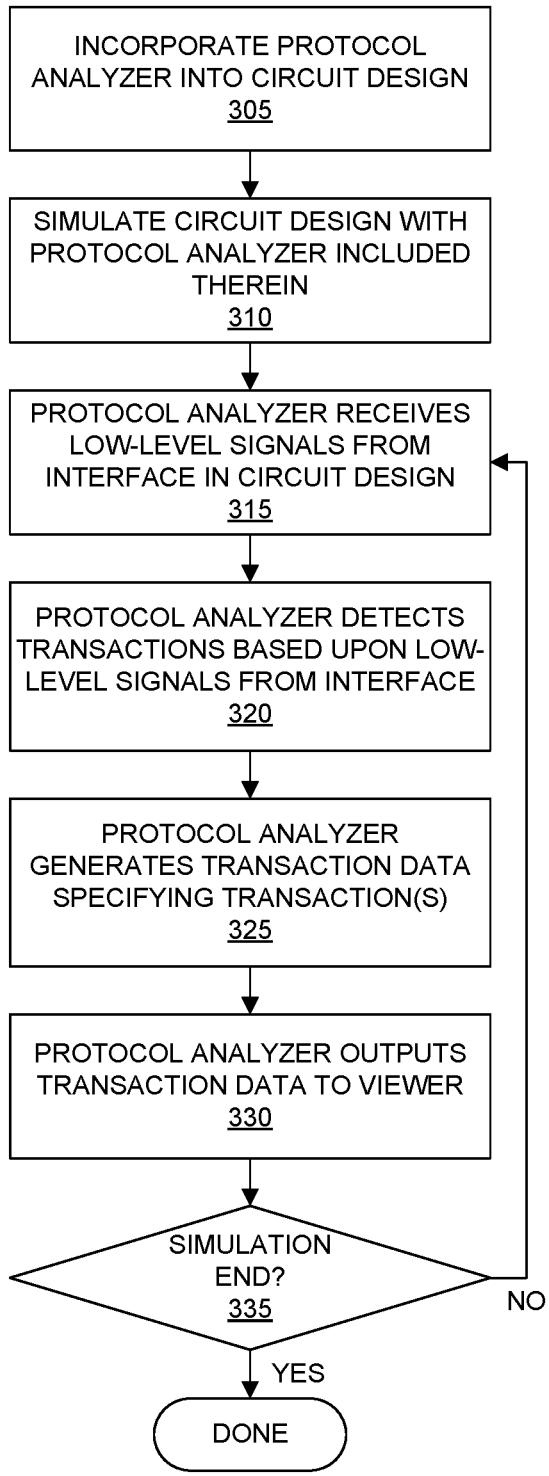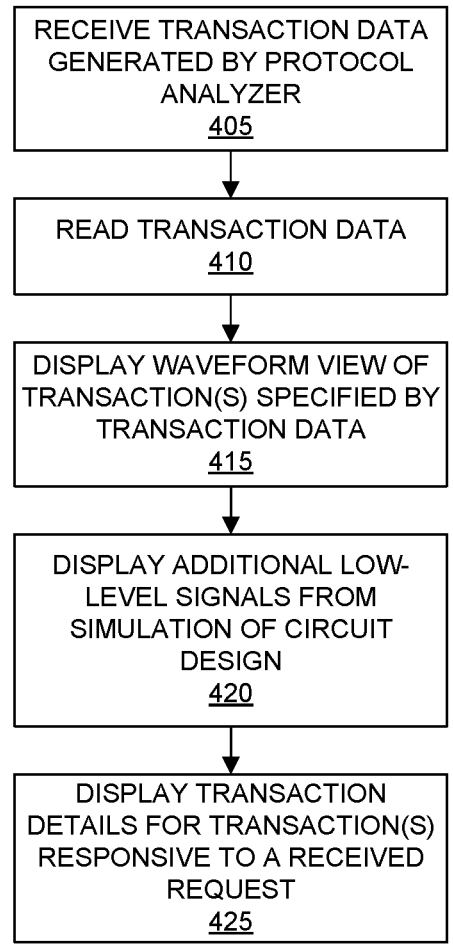
FIG. 3
FIG. 4

PROTOCOL ANALYSIS AND VISUALIZATION DURING SIMULATION

RESERVATION OF RIGHTS IN COPYRIGHTED MATERIAL

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

TECHNICAL FIELD

This disclosure relates to integrated circuits (ICs). More particularly, this disclosure relates to protocol analysis and visualization of transactions from simulation of a circuit design for an IC.

BACKGROUND

Designers of digital circuits rely upon computer aided techniques. Standard hardware description languages (HDLs) such as Verilog, System Verilog, and VHDL have been developed that are used to describe digital circuits. HDLs allow a designer to create a definition of a digital circuit design at the gate level, the register transfer level (RTL), or the behavioral level using abstract data types. A circuit design specified in an HDL may be processed by a computer-aided design tool for implementation as, or within, an integrated circuit.

HDL simulation is a technique for testing the behavior of hardware that is implemented from a circuit design specified in HDL. In some cases, HDL simulation involves building an executable model of the circuit design originally specified in HDL. The circuit design is often referred to as the "design under test" or "DUT". The resulting executable version of the circuit design is then executed in combination with an HDL simulator using a data processing system.

In general, HDL simulation includes two phases. The first phase is referred to as compilation. During compilation, the DUT is parsed, elaborated, and executable program code is generated from the DUT. The second phase is a runtime phase where the executable program code generated during compilation is loaded into memory of a data processing system and executed.

SUMMARY

One or more embodiments are directed to methods for protocol analysis. In one aspect, a method can include simulating, using a processor, a circuit design including a protocol analyzer embedded therein. The protocol analyzer is coupled to low-level signals of an interface of the circuit design. The method can include, during the simulating, the protocol analyzer detecting a transaction from the low-level signals received from the interface and the protocol analyzer generating transaction data specifying the transaction. The method can also include outputting, from the protocol analyzer, the transaction data.

One or more embodiments are directed to systems for protocol analysis. In one aspect, a system includes a memory configured to store program code and a processor coupled to the memory. The processor, in response to executing the program code, is configured to initiate operations. The operations include simulating a circuit design including a protocol analyzer embedded therein. The protocol analyzer is coupled to low-level signals of an interface of the circuit design. The operations can include, during the simulating, the protocol analyzer detecting a transaction from the low-level signals received from the interface and the protocol analyzer generating transaction data specifying the transaction. The operations can also include outputting, from the protocol analyzer, the transaction data.

One or more embodiments are directed to computer program products for protocol analysis. In one aspect, a computer program product includes a computer readable storage medium having program code stored thereon. The program code is executable by a processor to perform operations including simulating, using the processor, a circuit design including a protocol analyzer embedded therein. The protocol analyzer is coupled to low-level signals of an interface of the circuit design. The operations can include, during the simulating, the protocol analyzer detecting a transaction from the low-level signals received from the interface and the protocol analyzer generating transaction data specifying the transaction. The operations can also include outputting, from the protocol analyzer, the transaction data.

This Summary section is provided merely to introduce certain concepts and not to identify any key or essential features of the claimed subject matter. Other features of the inventive arrangements will be apparent from the accompanying drawings and from the following detailed description.

BRIEF DESCRIPTION OF THE DRAWINGS

The inventive arrangements are illustrated by way of example in the accompanying drawings. The drawings, however, should not be construed to be limiting of the inventive arrangements to only the particular implementations shown. Various aspects and advantages will become apparent upon review of the following detailed description and upon reference to the drawings.

FIG. 3 illustrates an example method of simulation.

FIG. 4 illustrates an example method of visualizing transaction data.

DETAILED DESCRIPTION

Figure 1:
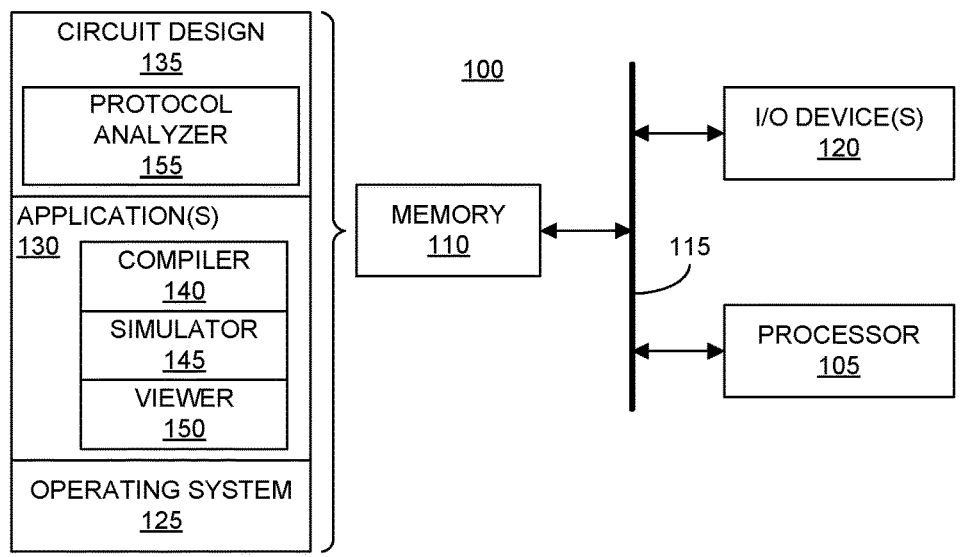
FIG. 1 illustrates an example of a data processing system for use with one or more embodiments described herein.

While the disclosure concludes with claims defining novel features, it is believed that the various features described within this disclosure will be better understood from a consideration of the description in conjunction with the drawings. The process(es), machine(s), manufacture(s) and any variations thereof described herein are provided for purposes of illustration. Specific structural and functional details described within this disclosure are not to be interpreted as limiting, but merely as a basis for the claims and as a representative basis for teaching one skilled in the art to variously employ the features described in virtually any appropriately detailed structure. Further, the terms and phrases used within this disclosure are not intended to be limiting, but rather to provide an understandable description of the features described.

This disclosure relates to integrated circuits (ICs) and, more particularly, to simulating a circuit design for an IC. In accordance with the inventive arrangements described within this disclosure, signal level data generated during the simulation of a circuit design can be processed and converted into transaction level data. The transaction level data can be output from the simulation and presented through a viewer on a display device.

In one or more embodiments, a protocol analyzer is incorporated into the circuit design. The protocol analyzer is coupled to low-level signals of interest in the circuit design. The protocol analyzer is simulated as part of the circuit design. In particular embodiments, the protocol analyzer processes the low-level signals generated by the simulated circuit design to recognize higher level transactions. For example, the protocol analyzer is capable of detecting transactions such as data transfers that occur between circuit blocks of the circuit design based upon an analysis of the low-level signals. The protocol analyzer is capable of generating transaction data specifying the detected transactions.

In particular embodiments, the protocol analyzer is capable of outputting the transaction data directly to a viewer. The viewer is capable of reading and interpreting the transaction data output from the protocol analyzer. The viewer is capable of displaying transactions specified by the transaction data as one or more waveforms. The viewer is capable of displaying waveforms representing the transaction directly from the transaction data received from the protocol analyzer. In doing so, the viewer need not perform any protocol analysis of the low-level signals. The transaction data generated by the protocol analyzer module is directly consumable by the viewer.

In accordance with the inventive arrangements described within this disclosure, a transaction level view is generated and provided without relying upon the simulator and/or viewer having built-in protocol analysis capabilities. By inserting the protocol analyzer directly into the circuit design and simulating the circuit design, the protocol analysis capabilities are incorporated into the circuit design itself. In one or more embodiments, the protocol analyzer is capable of generating transaction data that directly targets the viewer and/or the visualization of the particular communication protocol that is analyzed. In particular embodiments, the transaction data includes instructions for the viewer that, when executed, cause the viewer to display transactions specified by the transaction data. The transactions, as displayed by the viewer, are formatted based upon the instructions or other information included within the transaction data.

Further aspects of the inventive arrangements are described below in greater detail with reference to the figures. For purposes of simplicity and clarity of illustration, elements shown in the figures have not necessarily been drawn to scale. For example, the dimensions of some of the elements may be exaggerated relative to other elements for clarity. Further, where considered appropriate, reference numbers are repeated among the figures to indicate corresponding, analogous, or like features.

FIG. 1 illustrates an example of a data processing system (system) 100 for use with one or more embodiments described herein. In an aspect, system 100 is implemented as a computer or other system or device that is suitable for storing and/or executing program code. In the example of FIG. 1, system 100 includes at least one processor 105. Processor 105 is coupled to memory 110 through interface circuitry 115. System 100 stores computer readable instructions (also referred to as "program code") within memory 110. Memory 110 is an example of computer readable storage media. Processor 105 executes the program code accessed from memory 110 via interface circuitry 115.

Memory 110 includes one or more physical memory devices such as, for example, a local memory and a bulk storage device. Local memory refers to non-persistent memory device(s) generally used during actual execution of program code. Examples of local memory include random access memory (RAM) and/or any of the various types of RAM that are suitable for use by a processor during execution of program code (e.g., dynamic RAM or "DRAM", synchronous DRAM or "SDRAM", and double data rate RAM or "DDR RAM"). A bulk storage device refers to a persistent data storage device. Examples of bulk storage devices include, but are not limited to, a hard disk drive (HDD), a solid-state drive (SSD), flash memory, a read-only memory (ROM), an erasable programmable read-only memory (EPROM), electrically erasable programmable read-only memory (EEPROM), or other suitable memory. System 100 may also include one or more cache memories (not shown) that provide temporary storage of at least some program code to reduce the number of times program code must be retrieved from a bulk storage device during execution.

Memory 110 is capable of storing program code. The program code may include routines, programs, objects, components, logic, data structures, and so on. For purposes of illustration, memory 110 stores an operating system 125, one or more application(s) 130, and a circuit design 135. Circuit design 135 includes a protocol analyzer 155 embedded or included therein. Applications 130 may include an optional compiler 140, a simulator 145, and a viewer 150. In one or more embodiments, application(s) 130 include an EDA application (not shown). The EDA application is capable of performing a design flow (e.g., synthesis, placement, routing, and/or bitstream generation) on circuit design 135 to implement circuit design 135, or a version thereof without protocol analyzer 155, within an IC.

In one or more embodiments, compiler 140 is an HDL compiler capable of compiling HDL circuit designs. In that case, circuit design 135 is specified as an HDL circuit design. Protocol analyzer 155 may be specified as an HDL file or module, e.g., a core. Compiler 140 is capable of integrating protocol analyzer 155 within circuit design 135. Simulator 145 is capable of simulating circuit design 135, with protocol analyzer 155 included therein, using an HDL test bench. In particular embodiments, simulator 145 is capable of converting circuit design 135 (e.g., in HDL form), with protocol analyzer 155 embedded therein, into an executable model and execute the executable model to simulate circuit design 135.

In one or more other embodiments, simulator 145 is capable of interpreting circuit design 135 (e.g., in HDL form) with protocol analyzer 155 embedded therein to simulate circuit design 135. As such, circuit design 135 is interpreted by simulator 145 without having to generate an executable model. For example, the HDL of circuit design 135 is simulated through interpretation by simulator 145.

In one or more other embodiments, circuit design 135 is specified using a high-level programming language. Examples of high-level programming languages include, but are not limited to, C, C++, and SystemC. In the case where circuit design 135 is specified in a high-level programming language, compiler 140 is capable of embedding protocol analyzer 155 within circuit design 135 in any of a variety of different ways. In the case where circuit design 135 is specified in C or C++, protocol analyzer 155 may be inserted into circuit design 135 as, for example, a static library, a dynamic library, or object code. Accordingly, compiler 140, for example, is capable of generating standalone executable program code from circuit design 135 having protocol analyzer 155 embedded therein. In that case, simulator 145 may be implemented as an executable library that is executed in parallel to the executable program code version of circuit design 135. Compiler 140 is capable of linking the executable program code version of circuit design 135 with the executable library implementation of simulator 145 for execution as a single executable by processor 105.

Viewer 150 is capable of displaying data, including transaction data, generated by simulating circuit design 135 in any of the various forms described herein.

In an aspect, operating system 125 and application(s) 130, being implemented in the form of executable program code, are executed by system 100 and, more particularly, by processor 105, to perform the operations described within this disclosure. As such, operating system 125 and application(s) 130 may be considered an integrated part of system 100. Further, it should be appreciated that any data used, generated, and/or operated upon by system 100 (e.g., processor 105) are functional data structures that impart functionality when employed as part of the system.

Examples of interface circuitry 115 include, but are not limited to, an input/output (I/O) subsystem, an I/O interface, a bus system, and a memory interface. For example, interface circuitry 115 may be one or more of any of several types of bus structures, including a memory bus or memory controller, a peripheral bus, an accelerated graphics port, and a processor or local bus using any of a variety of bus architectures. Examples of bus architectures include, but are not limited to, Industry Standard Architecture (ISA) bus, Micro Channel Architecture (MCA) bus, Enhanced ISA (EISA) bus, Video Electronics Standards Association (VESA) local bus, and Peripheral Component Interconnect (PCI) bus.

System 100 further may include one or more input/output (I/O) devices 120 coupled to interface circuitry 115. I/O devices 120 may be coupled to system 100, e.g., interface circuitry 115, either directly or through intervening I/O controllers. Examples of I/O devices 120 include, but are not limited to, a keyboard, a display device, a pointing device, one or more communication ports, a network adapter, etc. A network adapter refers to circuitry that enables system 100 to become coupled to other systems, computer systems, remote printers, and/or remote storage devices through intervening private or public networks. Modems, cable modems, Ethernet cards, and wireless transceivers are examples of different types of network adapters that may be used with system 100.

System 100 may include fewer components than shown or additional components not illustrated in FIG. 1 depending upon the particular type of device and/or system that is implemented. In addition, the particular operating system and/or application(s) included may vary according to device and/or system type as may the types of I/O devices included. Further, one or more of the illustrative components may be incorporated into, or otherwise form a portion of, another component. For example, a processor may include at least some memory.

Figure 2:
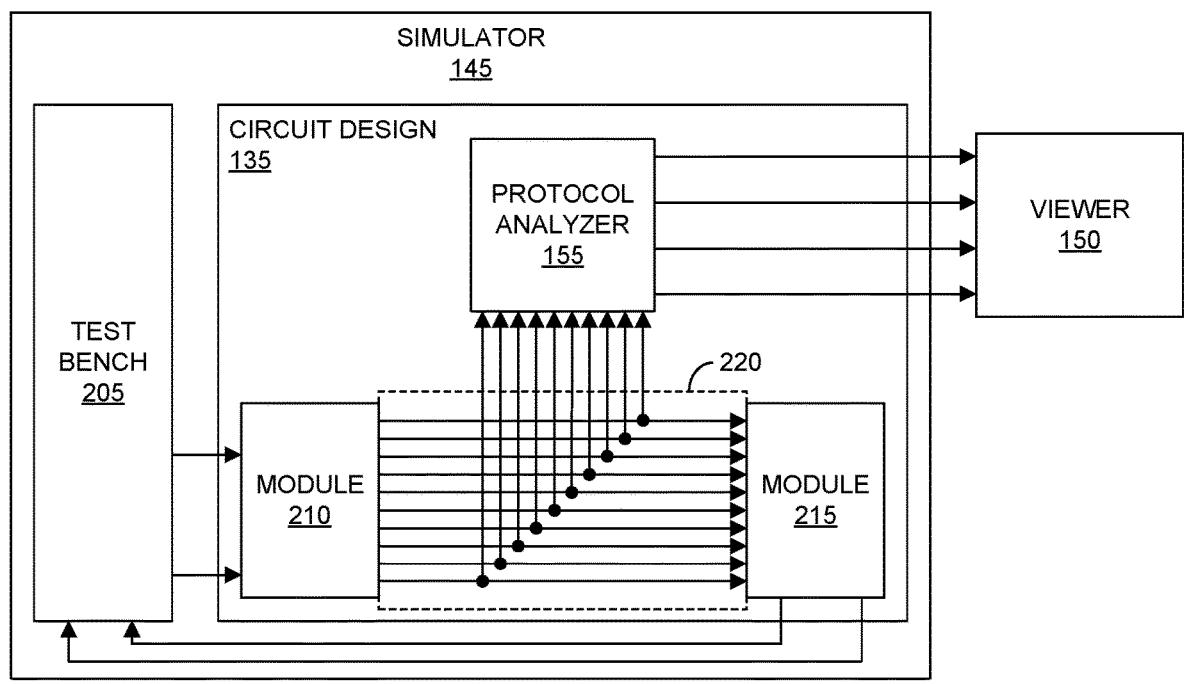
FIG. 2 illustrates an example of an executable architecture including a simulator and viewer.

FIG. 2 illustrates an example of an executable architecture including a simulator and viewer. The example architecture of FIG. 2 may be executed by a system the same as, or similar to, the system described in connection with FIG. 1.

Circuit design 135 includes different modules. In one or more embodiments, each module is implemented as a portion of program code (e.g., HDL code and/or high-level programming language) that represents a circuit block or a subsystem of circuit design 135 when implemented within an IC. In the example of FIG. 2, circuit design 135 includes modules 210 and 215. Modules 210 and 215 are capable of communicating with one another through an interface 220.

In one or more embodiments, interface 220 is an on-chip interconnect. An example of an on-chip interconnect is an Advanced Microcontroller Bus Architecture (AMBA) eXtensible Interface (AXI) bus. An AMBA AXI bus is an embedded microcontroller bus interface for use in establishing on-chip connections between circuit blocks and/or systems. For example, module 210 and module 215 each have one or more AXI-compliant ports wired together forming interface 220. AXI is provided as an illustrative example of an interface and is not intended as a limitation of the embodiments described within this disclosure. Other examples of interface 220 include, but are not limited to, other types of buses, a network-on-chip (NoC), a cross-bar, or other type of switch.

Protocol analyzer 155 has been incorporated into circuit design 135. For example, a designer may request protocol analysis of the signals exchanged between module 210 and module 215. In response to a request for protocol analysis, compiler 140 includes protocol analyzer 155 within circuit design 135 and establishes connections from interface 220 to protocol analyzer 155 as shown. Once incorporated, protocol analyzer 155 is simulated as part of circuit design 135 by simulator 145.

In one or more embodiments, simulator 145 is capable of simulating circuit design 135 as the device under test using a test bench 205. In one or more embodiments, compiler 140 is capable of building an executable model of circuit design 135, with protocol analyzer 155 included therein. The resulting executable version of circuit design 135 (illustrated in FIG. 2 as circuit design 135) is then executed in combination with simulator 145.

Test bench 205 is capable of driving one or more inputs into circuit design 135 during simulation and is capable of monitoring or collecting one or more of the outputs generated by circuit design 135 during the simulation. For purposes of illustration, test bench 205 is capable of driving one or more inputs into module 210 and receiving one or more outputs from module 215.

In the case of an interpreted system, simulator 145 is capable of translating circuit design 135, with protocol analyzer 155 included therein, into an intermediate form (e.g., intermediate representation). Examples of intermediate form include, but are not limited to, stack machine code, two address code, three address code, and/or a graph data structure. Other examples of intermediate form include, but are not limited to LLVM and GNU Compiler Collection (GCC). While the intermediate form of circuit design 135 is not directly executable by processor 105, processor 105 is capable of executing the intermediate form of circuit design 135 using simulator 145, which is capable of reading the instructions contained in the intermediate form.

During simulation, and when implemented as hardware, modules 210 and 215 are capable of exchanging a large number of signals through interface 220. During simulation, this activity is captured as events that represent the time changing values of the low-level (e.g., logic) signals of circuit design 135. The low-level signals, for example, are bit-level signals. As an illustrative and non-limiting example, module 210 and module 215 may be coupled by approximately 40 different signals (e.g., wires). The wires or low-level signals that connect module 210 to module 215, taken collectively, constitute interface 220. The values (e.g., events) carried by these signals specify or implement transactions. The transactions are data flows between modules 210 and 215. For example, the transactions may be read transactions and/or write transactions.

The signals exchanged between module 210 and module 215 typically conform to a complex inter-module interface as described above in order to effectuate the data transfers. In order to debug circuit design 135 and accurately evaluate the inner-workings of circuit design 135, a designer must understand the activity taking place between modules 210 and 215 on a transactional level. Observation of the various individual low-level signals exchanged between module 210 and module 215 makes understanding transaction-level information difficult since the starts and ends of individual transactions are not apparent from the low-level signals.

In the example of FIG. 2, protocol analyzer 155 is capable of generating transaction level information referred to as "transaction data" during the course of simulation. Protocol analyzer 155 is capable of receiving event level data from interface 220 relating to the signals (or events) exchanged between module 210 and module 215. Protocol analyzer 155 receives the event data as inputs.

Protocol analyzer 155, whether specified in HDL or using another programming language, includes processes that are capable of processing received low-level signals from interface 220. In creating an executable model of circuit design 135, for example, compiler 140 and/or simulator 145 is capable of generating executable processes for the processes of protocol analyzer 155. Protocol analyzer 155 is tailored, or specific to, the particular protocol being analyzed. In this example, if interface 220 implements an AXI bus, protocol analyzer 155 is capable of understanding AXI protocol. For example, protocol analyzer 155 is capable of detecting read transactions and write transactions conducted between module 210 and module 215 via interface 220.

Protocol analyzer 155 analyzes the received low-level signals and converts the low-level signals into transaction data. In one or more embodiments, protocol analyzer 155 outputs the transaction data to viewer 150. Protocol analyzer 155 is capable of outputting the transaction data to viewer 150 during the simulation. In one or more other embodiments, protocol analyzer 155 is capable of writing the transaction data to a memory such as memory 110. In that case, viewer 150 is capable of rendering the transaction data at a time subsequent to simulation. In particular embodiments, protocol analyzer 155 is capable of outputting the transaction data to viewer 150 during simulation and also store the transaction data in memory 110 for subsequent use.

In one or more embodiments, the transaction data specifies a waveform representing one or more transactions detected from the low-level signals. The transaction data is capable of directly specifying or representing the transaction(s) that are detected from the individual logic-level signals being analyzed. The transaction data, for example, directly specifies to viewer 150 what transactions to draw within a waveform view. The transaction data further may specify one or more transaction details to display for each transaction.

As an illustrative and non-limiting example, protocol analyzer 155 is capable of tracking the signaling occurring on interface 220 during simulation. Protocol analyzer 155 is capable of detecting, from the low-level signals exchanged between module 210 and module 215, the start of a data transfer, the address of the data transfer, and the data bytes including the end of the data transfer or other signals indicating the end of the data transfer. Protocol analyzer 155 processes the individual low-level signals representing the transaction into transaction data specifying a waveform, e.g., a single waveform, representing the transaction as a whole. The transaction data specifies a start time and an end time for the transaction. Viewer 150 is capable of receiving the transaction data from protocol analyzer 155 and directly consuming the data. Viewer 150 is capable of displaying the transaction specified by the transaction data in a waveform view as a waveform.

In one or more embodiments, protocol analyzer 155 is capable of including additional transaction details for the transactions specified in the transaction data that may be displayed by viewer 150. In particular embodiments, protocol analyzer 155 is capable of including instructions within the transaction data that instruct viewer 150 how to present the transactions. For example, the instructions may specify a particular color to be used when rendering each transaction, a text label to be displayed for each transaction, and/or other instructions.

In conventional hardware debugging systems, the debugging system itself is used to post process the low-level signals captured during the simulation. By incorporating protocol analyzer 155 within the circuit design itself, the hardware debugging tools need not have protocol analyzer functionality. It should be appreciated that protocol analyzer 155 is incorporated into circuit design 135 for purposes of simulation. If implementing circuit design 135 within an actual IC, protocol analyzer 155 is not included in circuit design 135. Further, protocol analyzer 155 is passive in that protocol analyzer 155 does not inject events into circuit design 135 as is the case with test bench 205. Rather, protocol analyzer 155 is capable of analyzing low-level signals obtained from circuit design 135 and providing the results of the analysis to viewer 150.

In one or more embodiments, protocol analyzer 155 outputs the transaction data to viewer 150 as one or more signals, where each signal specifies a transaction waveform showing the start and end of the transaction occurring over time. In particular embodiments, protocol analyzer 155 outputs one or more additional signals as transaction data to viewer 150 including text that specifies the same start time and the end time for a transaction waveform. The additional signals specifying text, for example, are capable of specifying additional transaction details.

FIG. 3 illustrates an example method 300 of simulation. Method 300 may be performed by a system the same as or similar to system 100 described in connection with FIG. 1. Method 300 may begin in a state where a user, e.g., a circuit designer, has selected an interface within the circuit design for protocol analysis. For example, using a simulator or other EDA tool, the user designates or selects a particular interface within the circuit design to be simulated as illustrated in FIG. 2. The selection of the interface for protocol analysis causes the system to automatically insert a protocol analyzer for the interface.

In block 305, the system incorporates the protocol analyzer into the circuit design. In one or more embodiments, the system is capable of incorporating a protocol analyzer specified in a high-level programming language within a high-level programming language description of a circuit design as described in connection with FIG. 1.

In one or more embodiments, the system is capable of executing a compiler that inserts the HDL of the protocol analyzer into the circuit design and couples the inputs of the protocol analyzer to the selected interface. For example, the compiler is capable of incorporating the protocol analyzer into the circuit design through compilation. The protocol analyzer is coupled to the low-level signals of the interface within the circuit design from the compilation. The system further is capable of coupling the outputs of the protocol analyzer to the viewer. As an illustrative and non-limiting example, the user may select an AXI interface of the circuit design for protocol analysis. The AXI interface may couple two modules of the circuit design. The system is capable instantiating the protocol analyzer within the circuit design.

The system is also capable of parameterizing the protocol analyzer. For example, the system is capable of replacing variables within the program code (e.g., HDL or high-level programming language) of the protocol analyzer with constants so that width of the various inputs of the protocol analyzer match or correspond to the different low-level signals and channels of the interface that are to be analyzed during simulation. The system is capable of instantiating wires within the circuit design as may be required. The protocol analyzer, for example, may be wired to the wires of the interface.

The protocol analyzer is capable of providing outputs, e.g., test points, at run time of the simulation for another component such as viewer 150 to monitor. The viewer is capable of monitoring the outputs of the protocol analyzer. At the conclusion of block 305, the system has generated a fully unified circuit design that incorporates the protocol analyzer.

In block 310, the system simulates the circuit design with the protocol analyzer included therein. In one or more embodiments, the system is capable of simulating the circuit design using interpretation. For example, in cases where the circuit design is specified using HDL, the simulator is capable of simulating the circuit design through interpretation.

In one or more embodiments, where the circuit design is specified in HDL, the simulator is capable of generating an executable model of the circuit design. The simulator executes the test bench, which injects inputs to the circuit design. In simulating the circuit design, the simulator generates events representing the time varying values of the low-level signals exchanged between different modules and components of the circuit design. The test bench is further capable of receiving outputs generated by the circuit design.

In one or more embodiments, the recording of events anywhere in an HDL implementation of the circuit design, including those of the test bench, occurs outside of the compiled circuit design itself. For example, library program code may be coupled to the compiled design. The library program code is capable of capturing the events, saving the events to a file, and/or forwarding the events to another application such as the viewer.

In one or more other embodiments, the circuit design is specified as a block diagram in which one or more individual blocks consist of HDL source code or some other source code. In that case, in block 305, the compiler is capable of determining configuration parameters to produce an HDL design and inserting the protocol analyzer within the circuit design. The compiler is capable of translating the HDL design into a "kernel" executable that processor 105 can execute directly. The kernel executable may not have any graphical user interface. Simulator 145 is capable of starting and causing the kernel to run as a child process in block 310, where the child process is capable of communicating with simulator 145.

In one or more other embodiments, where the circuit design and/or protocol analyzer are specified in C, C++, or SystemC, the libraries (e.g., simulator 145) necessary to form a free-standing executable can be inserted into the circuit design in block 305. In that case, the protocol analyzer is also inserted into the circuit design. The circuit design is compiled using the compiler. The compiler generates a standalone executable that can be executed without the aid of a simulator, at least as described in relation to an HDL implementation of the circuit design. Such a simulation, through execution of the standalone executable, is capable of outputting results to the screen and/or to one or more files. The execution of the standalone executable takes place in block 310. In particular embodiments, the simulation libraries built into the standalone executable are capable of recording the events coming from the protocol analyzer and other events (e.g., signals) in the circuit design to a file. After the simulation is complete, the viewer is capable of loading the file and displaying the waveform(s).

In block 315, the protocol analyzer receives low-level signals from the interface in the circuit design during simulation. In block 320, the protocol analyzer detects transactions based upon the low-level signals from the interface. In describing operations performed in method 300, it should be appreciated that operations attributed to the protocol analyzer are also performed by the processor in executing the simulator and performing simulation of the circuit design.

In the case of a read transaction, for example, the protocol analyzer is capable of detecting a particular signal or a particular combination of signals that represent a read request occurring on a channel of the interface, the address from which data is to be read, the amount of data to be read, and the conveyance of data in response to the read request on another channel of the interface. The protocol analyzer is capable of detecting the end of the read transaction based upon the last portion of data (e.g., the last beat of data) returned in response to the read request. In particular embodiments, the protocol analyzer is capable of detecting each individual beat of data that is transferred (e.g., received).

In another example, in the case of a write transaction, the protocol analyzer is capable of detecting a particular signal or a particular combination of signals that represent a write request occurring on a channel of the interface, the address to which data is to be written, the amount of data to be written, the conveyance of data to be written on another channel of the interface, and/or an acknowledgement that the data was successfully written (which may be on another channel of the interface). In the case of a write transaction, the acknowledgement that the data was successfully written marks the end of the write transaction. In particular embodiments, the protocol analyzer is capable of detecting each individual beat of data that is transferred (e.g., sent).

In block 325, the protocol analyzer translates the low-level signals from the interface into transaction data for the viewer. For example, the protocol analyzer is capable of generating the transaction data directly from the low-level signals of the interface as observed during simulation. In one or more embodiments, the protocol analyzer generates a data structure that is understandable by the viewer. The transaction data specifies the transactions that are detected by the protocol analyzer. In particular embodiments, the transaction data specifies each transaction as a waveform, e.g., a single waveform, having a start simulation time and an end simulation time. Additional transaction details for the transaction such as the transaction type (e.g., read or write), address to be read or written, transaction identifier (ID), and other information can be specified as text within the data structure. The transaction data may also include one or more instructions that are executable by the viewer indicating how to display or render the transactions.

In block 330, the protocol analyzer outputs the transaction data. In one or more embodiments, the protocol analyzer outputs the transaction data to the viewer during the simulation. As an illustrative example, the protocol analyzer is capable of outputting the transaction data as one or more signals during the simulation. In another example, the protocol analyzer is capable of outputting the transaction data from an output port monitored by the viewer as one or more signals. In another example, the protocol analyzer outputs the transaction data to the view as a data structure.

In one or more other embodiments, the protocol analyzer is capable of outputting the transaction data to a file that is stored for subsequent recall and/or analysis.

In particular embodiments, the protocol analyzer is capable of continually outputting transaction data to the viewer and/or a file. For example, the protocol analyzer is capable of continually detecting transactions within the low-level signals from the interface and outputting the transaction data over time while the simulation continues to the viewer and/or the file.

In block 335, the system determines whether the simulation has ended. If so, method 300 can end. If not, method 300 can loop back to block 315 to continue processing.

In cases where the transaction data and/or one or more other signals (events) from the simulation is written to a file, subsequent to simulation, the viewer may be used to load and/or read the file to display the transaction data and/or other events within the file.

FIG. 4 illustrates an example method 400 of visualizing transaction data. Method 400 may be performed by a system the same as, or similar to, system 100 described in connection with FIG. 1. Method 400 may begin in a state where the protocol analyzer is outputting transaction data. The transaction data may be output directly to the viewer and/or stored in a file. Method 400 may be performed by the system in executing the viewer to process the transaction data generated during simulation. The viewer is capable of displaying the transaction data during the simulation (e.g., when received directly from the protocol analyzer) or subsequent to the simulation (e.g., when read from a file). In describing FIG. 4, the operations attributed to the system are performed in executing viewer 150.

In block 405, the viewer receives the transaction data generated by the protocol analyzer. The viewer is capable of receiving the transaction data from the protocol analyzer, e.g., during the simulation. The viewer is capable of monitoring the outputs of the protocol analyzer to receive any data output therefrom. The viewer is also capable of receiving the transaction data from a file.

In block 410, the viewer is capable of reading the transaction data. In block 415, the viewer is capable of displaying a waveform view of transactions specified by the transaction data. In one or more embodiments, each transaction may be specified as waveform, e.g., a block, having a defined starting point and a defined ending point on a timeline corresponding to the simulation.

In block 420, the viewer optionally displays one or more additional low-level signals from simulation of the circuit design. For example, in addition to displaying transaction data received from the protocol analyzer, the viewer is also capable of displaying other low-level signals obtained from simulating the circuit design. The low-level signals, which may be for the interface monitored by the protocol analyzer and from which the transaction data is generated and/or for other modules of the circuit design, may be displayed with the transactions from the transaction data in a common timeline.

In block 425, the viewer is capable of displaying one or more transaction details for each transaction. In one or more embodiments, the viewer is capable of receiving user requests, e.g., user inputs. The user inputs may be requests for additional information for one or more of the transactions. In response to receiving a user input requesting additional information for a transaction, the viewer is capable of displaying the additional detail(s) for the transaction specified by the received transaction data.

Figure 5:
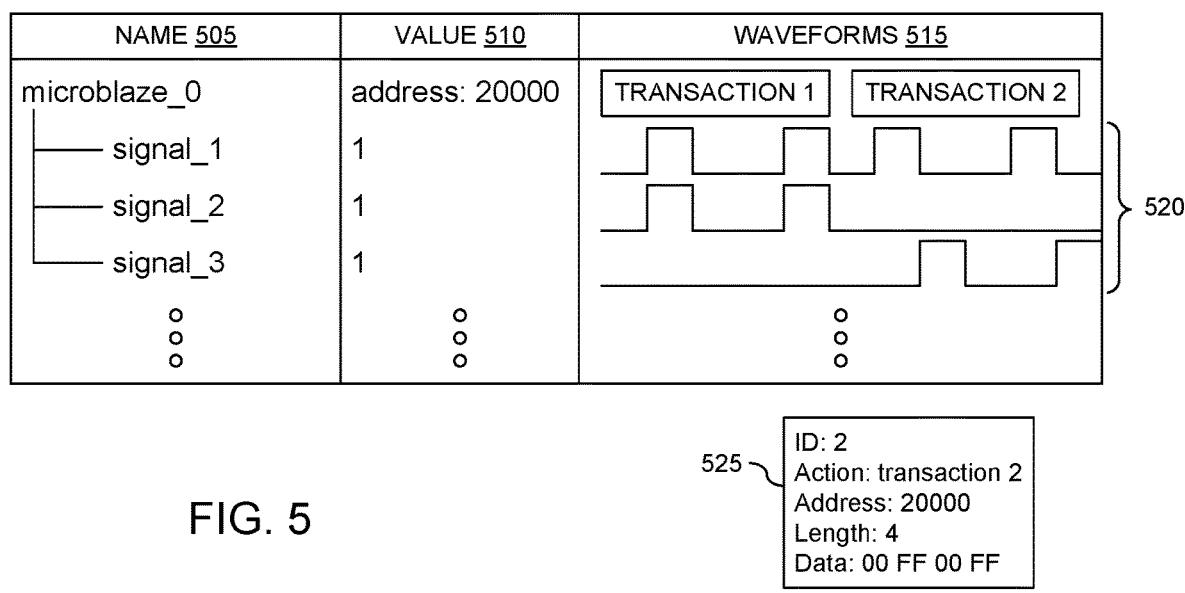
FIG. 5 illustrates an example user interface generated by a viewer as described in connection with FIG. 1.

FIG. 5 illustrates an example user interface 500 generated by viewer 150 of FIG. 1. In the example of FIG. 5, user interface 500 is a waveform viewer. User interface 500 includes a name region 505, a value region 510, and a waveform region 515. User interface 500 presents simulation data for a module called "microblaze_0". Name region 505 lists the names of signals and/or interfaces for which signals and/or transactions are displayed in waveform region 515. As pictured, name region 505 lists the interface "microblaze_0" and the low-level signals 1, 2, and 3.

In the example of FIG. 5, "microblaze_0" represents a soft processor. A soft processor is a circuit block that is capable of executing program code and is implemented using the programmable circuitry of an IC. A soft processor, for example, is formed in programmable circuitry of the IC in response to loading configuration data into the IC. Loading configuration data specifying the soft processor physically instantiates the soft processor within the programmable circuitry of the IC.

In this example, "microblaze_0" is coupled to another circuit block of the circuit design via an interface as previously described. The protocol analyzer has evaluated the low-level signals exchanged between "microblaze_0" and the other circuit block (e.g., signals 1, 2, 3, and any other signals not shown) and detected transaction 1 and transaction 2. Transactions 1 and 2 are encoded in transaction data that is provided from the protocol analyzer to the viewer and/or read from a file. The viewer reads the transaction data and displays transaction 1 and transaction 2 as waveforms in the waveforms region 515. Each of transaction 1 and transaction 2 are shown as a waveform (e.g., a discrete block) positioned on the timeline. Each waveform representing transactions 1 and 2 has a left edge aligned with the start time of the transaction on the timeline and the right edge aligned with the end time of the transaction on the timeline. Value region 510 displays the address corresponding to the transactions in this example.

As pictured, waveforms 520, corresponding to signals 1, 2, and 3 of the interface for "microblaze_0", are shown in waveforms region 515. Thus, the viewer is capable of displaying both the low-level signals and the transactions for a given interface. In this example, the low-level signals are the particular signals of the interface analyzed to determine transactions 1 and 2. In other embodiments, the user interface is also capable of displaying low-level signals from other circuits and/or components of the circuit design not analyzed for transaction determination.

In one or more embodiments, the waveforms representing transaction 1 and transaction 2 are visualized in accordance with instructions generated by the protocol analyzer and included in the transaction data. For example, the viewer is capable of color coding each transaction based upon color coding instructions included in the transaction data, applying a text label to each transaction as specified within the transaction data, or format other aspects of the transaction waveforms that are displayed.

In one or more embodiments, the protocol analyzer is capable of providing the dimensions of the waveform region (e.g., 515). The protocol analyzer is capable of providing the text that is displayed or included for transactions in name region 505 and waveforms region 515. The protocol analyzer is capable of determining additional instructions or preferences such as the colors to be used to draw transactions and/or waveforms from a file stored in memory.

In the example of FIG. 5, a request for transaction details has been received. In one example, the user selects a transaction using a pointer. For instance, the point may be made to hover over the waveform for transaction 2. In another example, the pointer is capable of selecting a transaction and further selecting a command (e.g., from a drop-down menu) requesting transaction details for the selected transaction. In any case, transaction details for the selected transaction, which is transaction 2 in this example, are shown in window 525. Window 525 may be presented as a tool tip, as a panel, or in another region of user interface 500. In one or more embodiments, the protocol analyzer directly instructs the viewer where on the timeline the viewer is able to display a tooltip, e.g., where the boxes corresponding to transactions are located. In the example of FIG. 5, window 525 is located in a position so as not to obscure the different regions of the interface. It should be appreciated, however, that as a tooltip, window 525 may be displayed proximate to the location of the pointer when the tooltip is invoked.

For purposes of explanation, specific nomenclature is set forth to provide a thorough understanding of the various inventive concepts disclosed herein. The terminology used herein, however, is for the purpose of describing particular aspects of the inventive arrangements only and is not intended to be limiting.

As defined herein, the singular forms "a," "an," and "the" are intended to include the plural forms as well, unless the context clearly indicates otherwise.

As defined herein, the terms "at least one," "one or more," and "and/or," are open-ended expressions that are both conjunctive and disjunctive in operation unless explicitly stated otherwise. For example, each of the expressions "at least one of A, B, and C," "at least one of A, B, or C," "one or more of A, B, and C," "one or more of A, B, or C," and "A, B, and/or C" means A alone, B alone, C alone, A and B together, A and C together, B and C together, or A, B and C together.

As defined herein, the term "automatically" means without user intervention. As defined herein, the term "user" means a human being.

As defined herein, the term "computer readable storage medium" means a storage medium that contains or stores program code and/or data for use by or in connection with an instruction execution system, apparatus, or device. As defined herein, a "computer readable storage medium" is not a transitory, propagating signal per se. A computer readable storage medium may be, but is not limited to, an electronic storage device, a magnetic storage device, an optical storage device, an electromagnetic storage device, a semiconductor storage device, or any suitable combination of the foregoing. The various forms of memory, as described herein, are examples of computer readable storage media. A non-exhaustive list of more specific examples of a computer readable storage medium may include: a portable computer diskette, a hard disk, a RAM, a read-only memory (ROM), an erasable programmable read-only memory (EPROM or Flash memory), an electronically erasable programmable read-only memory (EEPROM), a static random access memory (SRAM), a portable compact disc read-only memory (CD-ROM), a digital versatile disk (DVD), a memory stick, a floppy disk, or the like.

As defined herein, the term "if" means "when" or "upon" or "in response to" or "responsive to," depending upon the context. Thus, the phrase "if it is determined" or "if [a stated condition or event] is detected" may be construed to mean "upon determining" or "in response to determining" or "upon detecting [the stated condition or event]" or "in response to detecting [the stated condition or event]" or "responsive to detecting [the stated condition or event]" depending on the context.

As defined herein, the term "high-level programming language" means a programming language, or set of instructions, used to program a data processing system where the instructions have a strong abstraction from the details of the data processing system, e.g., machine language. For example, a high-level programming language may automate or hide aspects of operation of the data processing system such as memory management. The amount of abstraction typically defines how "high-level" the programming language is. Using a high-level programming language frees the user from dealing with registers, memory addresses, and other low-level features of the data processing system upon which the high-level programming language will execute. In this regard, a high-level programming language includes little or no instructions that translate directly, on a one-to-one basis, into a native opcode of a data processing system. Examples of high-level programming languages include, but are not limited to, C, C++, SystemC, OpenCL C, or the like.

As defined herein, the term "hardware description language" is a computer-language that facilitates the documentation, design, and manufacturing of a digital system, such as an integrated circuit. A hardware description language, or HDL, combines program verification techniques with expert system design methodologies. Using an HDL, for example, a user can design and specify an electronic circuit, describe the operation of the circuit, and create tests to verify operation of the circuit. An HDL includes standard, text-based expressions of the spatial and temporal structure and behavior of the electronic system being modeled. HDL syntax and semantics include explicit notations for expressing concurrency. In contrast to most high-level programming languages, an HDL also includes an explicit notion of time, which is a primary attribute of a digital system.

As defined herein, the term "responsive to" and similar language as described above, e.g., "if," "when," or "upon," means responding or reacting readily to an action or event. The response or reaction is performed automatically. Thus, if a second action is performed "responsive to" a first action, there is a causal relationship between an occurrence of the first action and an occurrence of the second action. The term "responsive to" indicates the causal relationship.

As defined herein, the terms "one embodiment," "an embodiment," "one or more embodiments," "particular embodiments," or similar language mean that a particular feature, structure, or characteristic described in connection with the embodiment is included in at least one embodiment described within this disclosure. Thus, appearances of the phrases "in one embodiment," "in an embodiment," "in one or more embodiments," "in particular embodiments," and similar language throughout this disclosure may, but do not necessarily, all refer to the same embodiment. The terms "embodiment" and "arrangement" are used interchangeably within this disclosure.

As defined herein, the term "processor" means at least one hardware circuit. The hardware circuit may be configured to carry out instructions contained in program code. The hardware circuit may be an integrated circuit. Examples of a processor include, but are not limited to, a central processing unit (CPU), an array processor, a vector processor, a digital signal processor (DSP), an FPGA, a programmable logic array (PLA), an ASIC, programmable logic circuitry, and a controller.

As defined herein, the term "output" means storing in physical memory elements, e.g., devices, writing to a display device or other peripheral output device, sending or transmitting to another system, exporting, or the like.

As defined herein, the term "real time" means a level of processing responsiveness that a user or system senses as sufficiently immediate for a particular process or determination to be made, or that enables the processor to keep up with some external process.

The terms first, second, etc. may be used herein to describe various elements. These elements should not be limited by these terms, as these terms are only used to distinguish one element from another unless stated otherwise or the context clearly indicates otherwise.

A computer program product may include a computer readable storage medium (or media) having computer readable program instructions thereon for causing a processor to carry out aspects of the inventive arrangements described herein. Within this disclosure, the term "program code" is used interchangeably with the term "computer readable program instructions." Computer readable program instructions described herein may be downloaded to respective computing/processing devices from a computer readable storage medium or to an external computer or external storage device via a network, for example, the Internet, a LAN, a WAN and/or a wireless network. The network may include copper transmission cables, optical transmission fibers, wireless transmission, routers, firewalls, switches, gateway computers and/or edge devices including edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations for the inventive arrangements described herein may be assembler instructions, instruction-set-architecture (ISA) instructions, machine instructions, machine dependent instructions, microcode, firmware instructions, or either source code or object code written in any combination of one or more programming languages, including an object-oriented programming language and/or procedural programming languages. Computer readable program instructions may include state-setting data. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a LAN or a WAN, or the connection may be made to an external computer (for example, through the Internet using an Internet Service Provider). In some cases, electronic circuitry including, for example, programmable logic circuitry, an FPGA, or a PLA may execute the computer readable program instructions by utilizing state information of the computer readable program instructions to personalize the electronic circuitry, in order to perform aspects of the inventive arrangements described herein.

Certain aspects of the inventive arrangements are described herein with reference to flowchart illustrations and/or block diagrams of methods, apparatus (systems), and computer program products. It will be understood that each block of the flowchart illustrations and/or block diagrams, and combinations of blocks in the flowchart illustrations and/or block diagrams, may be implemented by computer readable program instructions, e.g., program code.

These computer readable program instructions may be provided to a processor of a general-purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the operations specified in the flowchart and/or block diagram block or blocks.

The computer readable program instructions may also be loaded onto a computer, other programmable data processing apparatus, or other device to cause a series of operations to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various aspects of the inventive arrangements. In this regard, each block in the flowchart or block diagrams may represent a module, segment, or portion of instructions, which comprises one or more executable instructions for implementing the specified operations.

In some alternative implementations, the operations noted in the blocks may occur out of the order noted in the figures. For example, two blocks shown in succession may be executed substantially concurrently, or the blocks may sometimes be executed in the reverse order, depending upon the functionality involved. In other examples, blocks may be performed generally in increasing numeric order while in still other examples, one or more blocks may be performed in varying order with the results being stored and utilized in subsequent or other blocks that do not immediately follow. It will also be noted that each block of the block diagrams and/or flowchart illustration, and combinations of blocks in the block diagrams and/or flowchart illustration, may be implemented by special purpose hardware-based systems that perform the specified functions or acts or carry out combinations of special purpose hardware and computer instructions.

The corresponding structures, materials, acts, and equivalents of all means or step plus function elements that may be found in the claims below are intended to include any structure, material, or act for performing the function in combination with other claimed elements as specifically claimed.

One or more embodiments are directed to methods for protocol analysis. In one aspect, a method can include simulating, using a processor, a circuit design including a protocol analyzer embedded therein. The protocol analyzer is coupled to low-level signals of an interface of the circuit design. The method can include, during the simulating, the protocol analyzer detecting a transaction from the low-level signals received from the interface and the protocol analyzer generating transaction data specifying the transaction. The method can also include outputting, from the protocol analyzer, the transaction data.

In an aspect, the circuit design is specified in an HDL.

In another aspect, the transaction data is generated directly from the low-level signals of the interface during the simulating.

In another aspect, the detecting the transaction from the low-level signals includes determining a start of the transaction and a corresponding end of the transaction from the low-level signals received from the interface.

In another aspect, the method can include a viewer, executed by the processor, receiving the transaction data and displaying a waveform representing the transaction.

In another aspect, the method can include the protocol analyzer including a transaction detail for the transaction within the transaction data during the simulating. The viewer is capable of displaying the transaction detail in response to a request for additional information for the transaction.

In another aspect, the method can include the protocol analyzer including, during the simulating, an instruction for displaying the transaction within the transaction data. A viewer is capable of displaying the transaction based upon the instruction.

In another aspect, the interface couples a first module of the circuit design to a second module of the circuit design. For example, the interface may be an on-chip bus interface.

In another aspect, the method can include incorporating the protocol analyzer into the circuit design through compilation, wherein the protocol analyzer is coupled to the low-level signals of the interface from the compilation.

One or more embodiments are directed to systems for protocol analysis. In one aspect, a system includes a memory configured to store program code and a processor coupled to the memory. The processor, in response to executing the program code, is configured to initiate operations. The operations include simulating a circuit design including a protocol analyzer embedded therein. The protocol analyzer is coupled to low-level signals of an interface of the circuit design. The operations can include, during the simulating, the protocol analyzer detecting a transaction from the low-level signals received from the interface and the protocol analyzer generating transaction data specifying the transaction. The operations can also include outputting, from the protocol analyzer, the transaction data.

In an aspect, the circuit design is specified in an HDL.

In another aspect, the transaction data is generated directly from the low-level signals of the interface during the simulating.

In another aspect, the detecting the transaction from the low-level signals can include determining a start of the transaction and a corresponding end of the transaction from the low-level signals received from the interface.

In another aspect, the system includes a display device. A viewer is executable by the processor to receive the transaction data and display a waveform representing the transaction.

In another aspect, the protocol analyzer is configured to include a transaction detail for the transaction within the transaction data during the simulating. The viewer displays the transaction detail on the display device in response to a request for additional information for the transaction.

In another aspect, the protocol analyzer is configured to, during the simulating, include an instruction for displaying the transaction within the transaction data. A viewer is capable of displaying the transaction based upon the instruction.

In another aspect, the interface couples a first module of the circuit design to a second module of the circuit design. For example, the interface may be implemented as an on-chip bus interface.

In another aspect, the processor is configured to initiate operations further including compiling the circuit design by inserting the protocol analyzer into the circuit design and coupling the protocol analyzer to the interface within the circuit design.

One or more embodiments are directed to computer program products for protocol analysis. In one aspect, a computer program product includes a computer readable storage medium having program code stored thereon. The program code is executable by a processor to perform operations including simulating, using the processor, a circuit design including a protocol analyzer embedded therein. The protocol analyzer is coupled to low-level signals of an interface of the circuit design. The operations can include, during the simulating, the protocol analyzer detecting a transaction from the low-level signals received from the interface and the protocol analyzer generating transaction data specifying the transaction. The operations can also include outputting, from the protocol analyzer, the transaction data.

In an aspect, the circuit design is specified in an HDL.

In another aspect, the transaction data is generated directly from the low-level signals of the interface during the simulating.

In another aspect, the detecting the transaction from the low-level signals includes determining a start of the transaction and a corresponding end of the transaction from the low-level signals received from the interface.

In another aspect, the operations can include the viewer, executed by the processor, receiving the transaction data and displaying a waveform representing the transaction.

In another aspect, the operations can include the protocol analyzer including a transaction detail for the transaction within the transaction data during the simulating. The viewer is capable of displaying the transaction detail in response to a request for additional information for the transaction.

In another aspect, the operations can include the protocol analyzer including, during the simulating, an instruction for displaying the transaction within the transaction data. A viewer is capable of displaying the transaction based upon the instruction.

In another aspect, the interface couples a first module of the circuit design to a second module of the circuit design. For example, the interface may be an on-chip bus interface.

In another aspect, the operations can include incorporating the protocol analyzer into the circuit design by coupling the protocol analyzer to the low-level signals of the interface.

The description of the inventive arrangements provided herein is for purposes of illustration and is not intended to be exhaustive or limited to the form and examples disclosed. The terminology used herein was chosen to explain the principles of the inventive arrangements, the practical application or technical improvement over technologies found in the marketplace, and/or to enable others of ordinary skill in the art to understand the inventive arrangements disclosed herein. Modifications and variations may be apparent to those of ordinary skill in the art without departing from the scope and spirit of the described inventive arrangements. Accordingly, reference should be made to the following claims, rather than to the foregoing disclosure, as indicating the scope of such features and implementations.

What is claimed is:

1. A method for protocol analysis, comprising:
incorporating, using a processor, a protocol analyzer into a circuit design through compilation, wherein the protocol analyzer is coupled to low-level signals of an interface of the circuit design from the compilation, wherein the interface includes an on-chip bus interface connecting two modules of the circuit design;
simulating, using the processor executing a simulator, the circuit design including the protocol analyzer embedded therein;
during the simulating, the protocol analyzer detecting a transaction on the bus from the low-level signals of the bus;
during the simulating, the protocol analyzer generating transaction data specifying the transaction and including, within the transaction data, an instruction specifying formatting for presenting the transaction in a viewer; and
outputting, from the protocol analyzer and the simulator, the transaction data.

2. The method of claim 1, wherein the circuit design is specified in a hardware description language.

3. The method of claim 1, wherein the transaction data is generated directly from the low-level signals during the simulating.

4. The method of claim 1, wherein the detecting the transaction from the low-level signals comprises:
determining a start of the transaction and a corresponding end of the transaction from the low-level signals.

5. The method of claim 1, further comprising:
the viewer, executed by the processor, receiving the transaction data and displaying a waveform representing the transaction.

6. The method of claim 5, further comprising:
the protocol analyzer including a transaction detail for the transaction within the transaction data during the simulating;
wherein the viewer displays the transaction detail in response to a request for additional information for the transaction.

7. The method of claim 1, wherein the viewer is executable to display the transaction according to the instruction.

8. The method of claim 1, wherein the incorporating the protocol analyzer into the circuit design through compilation generates executable program code from the circuit design.

9. A system for protocol analysis, comprising:
a processor configured to initiate operations including:
incorporating a protocol analyzer into a circuit design through compilation, wherein the protocol analyzer is coupled to low-level signals of an interface of the circuit design from the compilation, wherein the interface includes an on-chip bus interface connecting two modules of the circuit design;
simulating, by executing a simulator, the circuit design including the protocol analyzer embedded therein;
during the simulating, the protocol analyzer detecting a transaction from the low-level signals of the bus;
during the simulating, the protocol analyzer generating transaction data specifying the transaction and including, within the transaction data, an instruction specifying formatting for presenting the transaction in a viewer; and
outputting, from the protocol analyzer and the simulator, the transaction data.

10. The system of claim 9, wherein the circuit design is specified in a hardware description language.

11. The system of claim 9, wherein the transaction data is generated directly from the low-level signals during the simulating.

12. The system of claim 9, wherein the detecting the transaction from the low-level signals comprises:
determining a start of the transaction and a corresponding end of the transaction from the low-level signals.

13. The system of claim 9, further comprising:
a display device, wherein the viewer is executable by the processor to receive the transaction data and display a waveform representing the transaction on the display device.

14. The system of claim 13, wherein:
the protocol analyzer is configured to include a transaction detail for the transaction within the transaction data during the simulating; and
the viewer displays the transaction detail on the display device in response to a request for additional information for the transaction.

15. The system of claim 9, wherein the viewer is executable to display the transaction according to the instruction.

16. A computer program product comprising a computer readable storage medium having program code stored thereon, the program code executable by a processor to perform operations for protocol analysis, the operations comprising:
incorporating a protocol analyzer into a circuit design through compilation, wherein the protocol analyzer is coupled to low-level signals of an interface of the circuit design from the compilation, wherein the interface includes an on-chip bus interface connecting two modules of the circuit design;
simulating, using the processor executing a simulator, the circuit design including the protocol analyzer embedded therein;
during the simulating, the protocol analyzer detecting a transaction on the bus from the low-level signals of the bus;
during the simulating, the protocol analyzer generating transaction data specifying the transaction and including, within the transaction data, an instruction specifying formatting for presenting the transaction in a viewer; and
outputting, from the protocol analyzer and the simulator, the transaction data.

* * * * *